United States Patent [19]
Moise

[11] Patent Number: 5,905,272
[45] Date of Patent: May 18, 1999

[54] OPTICAL RECEIVER

[75] Inventor: Theodore S. Moise, Dallas, Tex.

[73] Assignee: Texas Instruments Incorporated, Dallas, Tex.

[21] Appl. No.: 08/960,988

[22] Filed: Oct. 30, 1997

[51] Int. Cl.$^6$ .................................................. H01L 29/06
[52] U.S. Cl. .............................. 257/21; 257/21; 257/25; 257/458; 257/461
[58] Field of Search ............................... 257/21, 25, 431, 257/458, 461, 14, 184

[56] References Cited

U.S. PATENT DOCUMENTS 5,569,933  10/1996  Chu et al. .................................. 257/25

*Primary Examiner*—Minh Loan Tran
*Attorney, Agent, or Firm*—Christopher L. Maginniss; W. James Brady, III; Richard L. Donaldson

[57] ABSTRACT

Apparatus for optical communications (10, 110, 210) includes a low-temperature grown photoconductor (12, 140, 220) coupled to at least one resonant tunneling device (14, 120, 130, 230, 240). When exposed to an input light, low-temperature grown photoconductor (10, 110, 210) absorbs photons, which decreases the resistivity, and thus the resistance of the photoconductor. This decrease in resistance causes a decrease in the voltage drop across photoconductor (12, 140, 220), which causes a corresponding increase in the voltage drop across resonant tunneling device (14, 120, 130, 230, 140).

15 Claims, 3 Drawing Sheets

OPTICAL RECEIVER

TECHNICAL FIELD OF THE INVENTION

This invention relates in general to the field of electronic devices and systems. More particularly, the invention relates to apparatus and method for optical communication.

BACKGROUND OF THE INVENTION

Optical communications systems typically require optical receivers capable of rapidly delivering large voltage or current responses to incident optical signals.

One approach for obtaining a high speed optical receiver is to use a low-temperature grown gallium arsenide MSM (metal-semiconductor-metal) photoconductor. For these devices, source and drain contacts are made directly to the low-temperature grown gallium arsenide, and an incident optical signal is used to increase the channel conductance. In operation, illumination causes the photoconductor to absorb photons, which decreases the resistivity of the device. For low-temperature grown gallium arsenide, photoinduced conductance increases by a factor of $10^6$ have been observed. Low-temperature grown photoconductors exhibit fast turn-on response times because the photogenerated carriers have a short lifetime, typically less than 20 picoseconds. A disadvantage to the low-temperature grown photoconductor, however, is that it exhibits a long turn-off transient, typically greater than 10 nanoseconds.

Another approach uses an optically switched resonant tunneling device. Certain resonant tunneling devices exhibit opto-electric characteristics. These devices switch between a high conductance and low conductance electrical state depending on the level of illumination thereon. In the absence of light, the detector quickly returns to its original high conductance operating state, unlike the photoconductor, which is plagued by a long turn-off transient. A disadvantage of the optically switched resonant tunneling devices, however, is that the response times are slow compared to low-temperature grown photoconductors. A further disadvantage is that it is difficult to optimize the resonant tunneling device structure for direct optical interaction since the tunneling distance is much less than the absorption length.

Still another approach uses a PIN photodiode integrated with a resonant tunneling device. This approach uses a PIN photodiode as an optical detector, and the resonant tunneling device as a switch. This combination operates in a photocurrent mode, which creates a disadvantage of having to carefully match the PIN photocurrent to the peak current of the resonant tunneling device. A further disadvantage of this approach is that the combination requires a high intensity incident optical signal. Still another disadvantage of this combination is that it has a slower response time than the low-temperature grown photoconductor.

SUMMARY OF THE INVENTION

According to the teachings of the present invention, an apparatus for optical communication is provided which eliminates or substantially reduces the disadvantages and problems associated with previously developed optical receivers.

In one aspect of the invention, an optical receiver includes a low-temperature grown photoconductor coupled to at least one resonant tunneling device. When exposed to an input light, the low-temperature grown photoconductor absorbs photons which decreases the resistivity, and thus the resistance of the photoconductor. This decrease in resistance causes a decrease in the voltage drop across the photoconductor, which causes a corresponding increase in the voltage drop across the resonant tunneling device.

In another aspect of the invention, a communications system includes an optical receiver which further includes a low-temperature grown photoconductor vertically integrated with at least one resonant tunneling device.

A technical advantage of the present invention is the provision of an optical receiver with ultra fast response to an incident optical signal. Furthermore, the invention eliminates the disadvantage of long turn-off transients typically associated with photoconductive elements. A further advantage is that the invention dissipates very little power. The present invention is applicable to all digital communications applications including both point-to-point interconnects and nearly transparent interconnects.

BRIEF DESCRIPTION OF THE DRAWINGS

For a better understanding of the present invention, reference may be made to the accompanying drawings, in which.

DETAILED DESCRIPTION OF THE INVENTION

Figure 1:
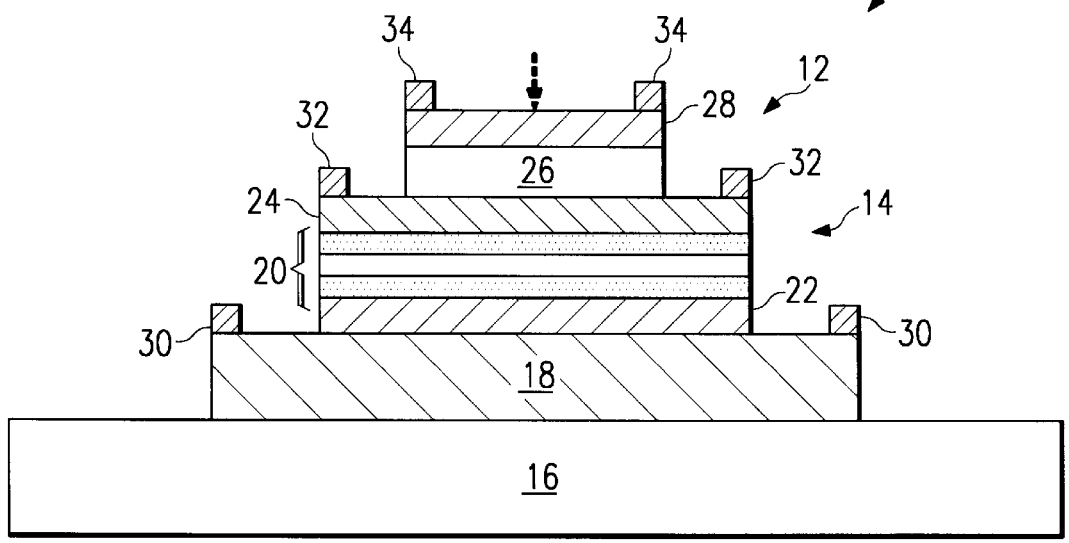
FIG. 1 is a simplified schematic diagram of an exemplary optical receiver constructed according to the teachings of the present invention.

The preferred embodiment(s) of the present invention is (are) illustrated in FIGS. 1–10, like reference numerals being used to refer to like and corresponding parts of the various drawings.

FIG. 1 is a simplified schematic diagram of an exemplary optical receiver 10 constructed according to the teachings of the present invention. Optical receiver 10 includes a low-temperature grown photoconductor 12 vertically integrated with a resonant tunneling device 14. Optical receiver 10 may be constructed on a semi-insulating substrate 16. Resonant tunneling device 14 includes an n+doped contact layer 18 grown on semi-insulating substrate 16. Contact layer 18 provides a means for external connection to optical receiver 10. Resonant tunneling device 14 further includes a double barrier structure 20 which is disposed between a first n+doped contact layer 22 and a second n+doped contact layer 24.

Low-temperature grown photoconductor 12, which operates to receive an incident optical signal, is integrally formed on second n+doped contact layer 24. Low-temperature grown photoconductor 12 includes a low-temperature layer 26 disposed between second n+doped contact layer 24 of resonant tunneling device 14, and an n+doped photoconductor contact layer 28. Ohmic contacts 30, 32 and 34 are formed on n+doped contact layers 18, 24 and 28, respectively, to provide for external connections to optical receiver 10.

Figure 2:
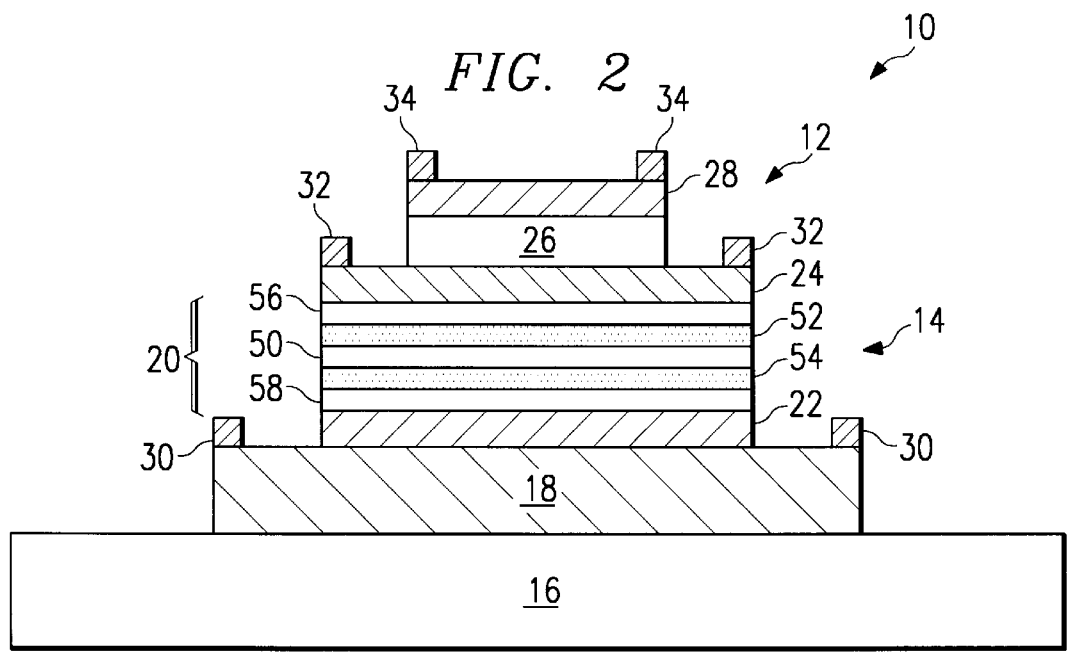
FIG. 2 is a simplified epitaxial layer diagram of an exemplary vertically integrated optical receiver constructed according to the teachings of the present invention.

FIG. 2 is an epitaxial layer diagram of optical receiver 10. Substrate 16 is formed with a semi-insulating material such as gallium arsenide. Contact layer 18, which is disposed on semi-insulating substrate 16, may be constructed from any material suitable to produce a functional contact surface such as 3,000 angstroms of n+doped gallium arsenide. The contact layers may alternatively be constructed from aluminum gallium arsenide, aluminum arsenide or indium gallium phosphide.

As described above, resonant tunneling device 14 includes double barrier structure 20 disposed between first n+doped contact layer 22 and second n+doped contact layer 24. First n+doped contact layer 22, which is formed on contact layer 18, may be formed, for example, with 1,000 angstroms of n+doped gallium arsenide. Second n+doped contact layer 24 may be fashioned in a similar manner using, for example, 2,000 angstroms of n+doped gallium arsenide.

Double barrier structure 20 includes a single quantum well layer 50 disposed between two barrier layers 52 and 54. Quantum well layer 50 and barrier layers 52 and 54 are further disposed between undoped spacer layers 56 and 58. Quantum well layer 50 may be, for example, 50 angstroms of undoped gallium arsenide. First and second barrier layers 52 and 54 surrounding quantum well layer 50 may each be formed, for example, of 30 angstroms of undoped aluminum arsenide. First and second undoped spacer layers 56 and 58 may each be formed, for example, with 500 angstroms of undoped gallium arsenide. Second n+doped contact layer 24, which completes the structure of resonant tunneling device 14, is disposed on first undoped spacer layer 56. This contact layer may be formed, for example, with 2,000 angstroms of n+doped gallium arsenide.

Low-temperature grown photoconductor 12 includes low temperature grown layer 26, which is disposed on second n+doped contact layer 24 of resonant tunneling device 14. Low-temperature grown layer 26 may be formed, for example, with gallium arsenide. Alternatively, low-temperature grown layer 26 may be formed with indium phosphide, or with indium gallium arsenide lattice-matched to indium phosphide.

The gallium arsenide in low-temperature grown layer 26 is typically grown at a temperature below 300° C. with a large V/III flux ratio. In this way, excess arsenide is incorporated into the crystalline structure. Following low-temperature growth, high quality epitaxially grown layers, such as n+doped photoconductor contact layer 28, may be grown on the low-temperature grown layer. The fact that the crystalline lattice stays intact despite the excess of arsenide is one of the appealing features of the low-temperature grown layer.

When photoconductor contact layer 28 is grown at normal temperatures on low-temperature layer 26, the excess arsenide atoms form arsenide clusters roughly 60 angstroms in diameter. These clusters deplete the semiconductor of carriers, thus creating a high resistivity material. Resistivities as high as $10^7$ ohm centimeters have been obtained using this method. Low-temperature grown layer 26 may range, for example, from 500 to 5,000 angstroms of gallium arsenide. Photoconductor contact layer 28 may be formed, for example, of 500 angstroms of n+doped gallium arsenide.

Ohmic contacts 30, 32 and 34 are formed on n+doped contact layers 18, 24 and 28, respectively. These contacts provide a means for external connection to optical receiver 10. The contact structures may be formed using any suitable material to provide an effective ohmic contact, such as titanium, nickel, gold, platinum gold or gold germanium. Contacts 30, 32 and 34 can take any suitable shape including an annular or a post form.

Figure 3:
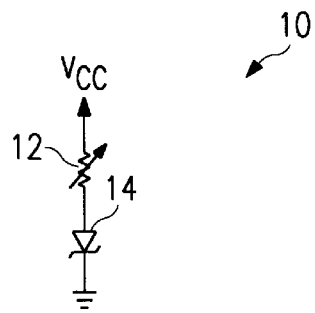
FIG. 3 is a simplified schematic diagram of an exemplary circuit representation of an optical receiver constructed according to the teachings of the present invention.

FIG. 3 is an exemplary circuit representation of optical receiver 10 in which low temperature-grown photoconductor 12 and resonant tunneling device 14 are coupled in series between a biasing voltage, $V_{cc}$, and ground. In operation, photoconductor 12 is exposed to an incident light, causing it to absorb photons. These photogenerated carriers decrease the resistivity, and thus the resistance of photoconductor 12. This decreased resistance, in turn, causes a decrease in the voltage drop across photoconductor 12, and a corresponding increase in the voltage drop across resonant tunneling device 14.

The photogenerated carriers have a very short lifetime, typically less than 20 picoseconds, which provides ultra fast turn-on response times. Photoconductors, in general, however, exhibit long turn-off transients, typically greater than 10 nanoseconds. In contrast, the switching speed of resonant tunneling device 14 is limited only by its RC time constant, which is typically on the order of 20 picoseconds. Furthermore, because resonant tunneling device 14 is a threshold switching device, its long photocurrent turn-off transient, which is below the device's threshold, does not lead to a switching event. Optical receiver 10 is sensitive to wavelengths extending to 950 nanometers for gallium arsenide based structures; to 1.6 micrometers for indium phosphide based structures.

By combining photoconductor 12 and resonant tunneling device 14, the positive effects of each device are used to complement the other. This combination yields optical receiver 10, which has ultra fast response to an incident optical signal, and eliminates the long turn-off transient typically associated with photoconductive elements.

Figure 4:
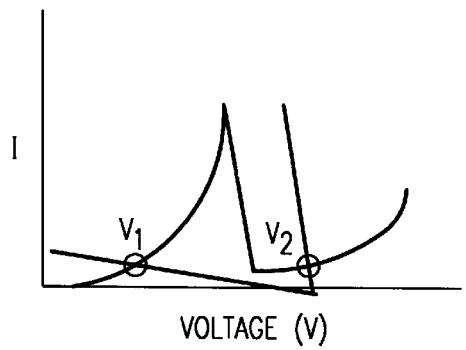
FIG. 4 is an exemplary current-voltage characteristic diagram of an exemplary optical receiver constructed according to the teachings of the present invention.

FIG. 4 shows the current-voltage characteristic curves of optical receiver 10. The spiked response represents the current-voltage characteristic of resonant tunneling device 14. The line passing through point $V_1$ represents the load line of photoconductor 12 in its non-illuminated, high resistance state. Conversely, the line passing through point $V_2$ represents photoconductor 12 load line under the illuminated, low resistance condition. As shown in FIG. 4, illuminating optical receiver 10 causes photoconductor 12 to switch from a low-conductance, high-voltage state to a high-conductance, low-voltage state. The decrease in voltage drop across photoconductor 12 causes a corresponding increase in the voltage drop across resonant tunneling device 14, causing a switching event.

Figure 5:
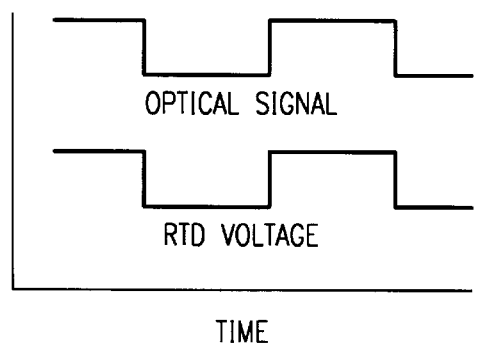
FIG. 5 is an exemplary timing diagram showing the response of an exemplary optical receiver to an incident optical sign according to the teachings of the present invention.

FIG. 5 is a timing diagram which illustrates the voltage drop across resonant tunneling device 14 in response to an incident optical signal.

Optical receiver 10 may also be constructed to facilitate transparent or nearly transparent applications. This result may be accomplished by constructing low-temperature grown layer 26 from materials such as indium phosphide rather than gallium arsenide. Similarly, contact layers 18, 22, 24 and 28 may be constructed of, for example, indium gallium arsenide, indium aluminum arsenide, aluminum arsenide, indium arsenide or other suitable materials. Constructing optical receiver 10 in this way facilitates transparent applications by allowing part of the optical signal to pass through, rather than being totally absorbed by optical receiver 10.

Figure 6:
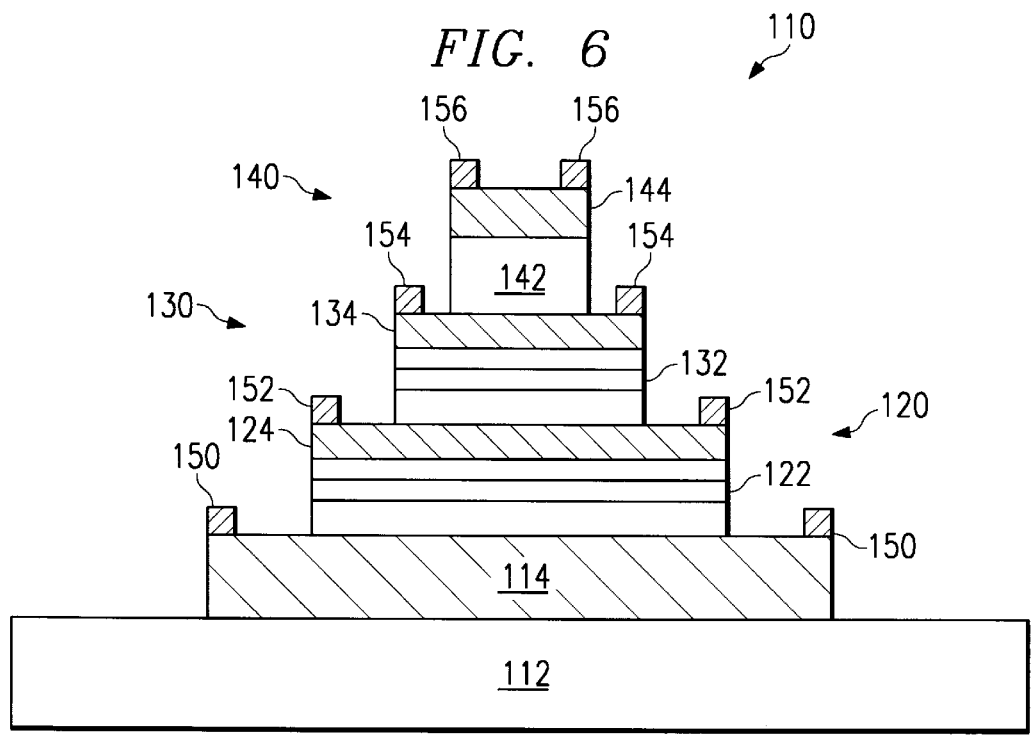
FIG. 6 is a simplified schematic diagram of an exemplary low-temperature grown photoconductor vertically integrated with a plurality of resonant tunneling devices according to the teachings of the present invention.

FIG. 6 is a simplified schematic diagram of an exemplary optical receiver 110 constructed according to the teachings of the present invention. Optical receiver 110 includes a low-temperature grown photoconductor 140 vertically integrated with a resonant tunneling device 130 having an area $A_1$. Resonant tunneling device 130 is then vertically integrated with an additional resonant tunneling device 120 having an area $A_2$, where $A_2$ is a different area than $A_1$. Optical receiver 110 may be constructed on a semi-insulating substrate 112. Substrate 112 is similar in structure and function to substrate 16 shown in FIGS. 1 and 2.

Resonant tunneling device 120 includes an n+doped contact layer 114 formed on semi-insulating substrate 112. Contact layer 114 is similar in structure and function to contact layer 22 of optical receiver 10. Resonant tunneling device 120 further includes a double barrier structure 122 disposed on contact layer 114. This double barrier structure is similar in structure and function to double barrier structure 20 of optical receiver 10. An n+doped contact layer 124 is disposed on double barrier structure 122. Contact layer 124 is similar in structure and function to contact layer 24 of optical receiver 10.

An additional double barrier structure 132 is disposed on contact layer 124. This double barrier structure is similar in structure and function to double barrier structure 20 of optical receiver 10. Next, an n+doped contact layer 134 is formed on double barrier structure 132. This contact layer is similar in structure and function to contact layer 22 of optical receiver 10. Contact layers 124 and 134, together with double barrier structure 132, form resonant tunneling device 130. Resonant tunneling devices 120 and 130 share contact layer 124.

Low-temperature grown photoconductor 140 is integrally formed on contact layer 134. Low-temperature grown photoconductor 140 includes a low-temperature grown layer 142 disposed between contact layer 134 of resonant tunneling device 130, and an n+doped photoconductor contact layer 144. Low-temperature grown layer 142 and contact layer 144 are similar in structure and function to low-temperature layer 26 and contact layer 28 of optical receiver 10. Ohmic contacts 150, 152, 154 and 156 are formed on contact layers 114, 124, 134 and 144, respectively, to provide for external connections to optical receiver 110. These ohmic contacts are similar in structure and function to ohmic contact 30 of optical receiver 10.

Figure 7:
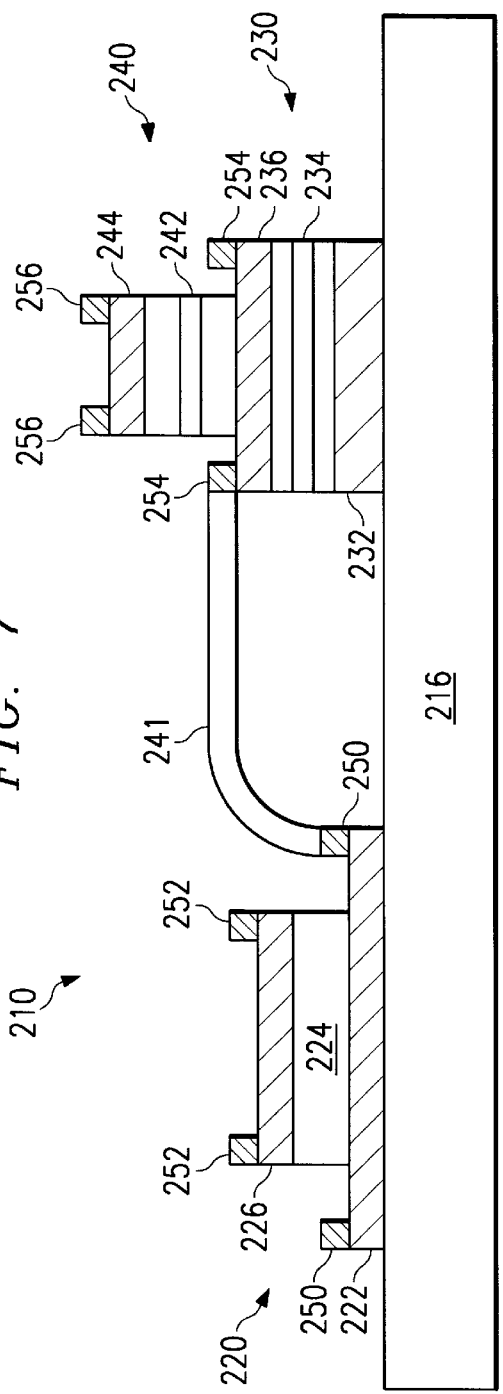
FIG. 7 is a simplified schematic diagram of an exemplary low-temperature grown photoconductor coupled to a plurality of resonant tunneling devices according to the teachings of the present invention.

FIG. 7 is a simplified schematic diagram of an exemplary optical receiver 210 constructed according to the teachings of the present invention. Optical receiver 210 includes a low-temperature grown photoconductor 220 coupled to a resonant tunneling device 230 having an area $A_1$. Resonant tunneling device 230 is then vertically integrated with at least one additional resonant tunneling device 240 having an area $A_2$, where $A_2$ is a different area than $A_1$. Low-temperature grown photoconductor 220 may be coupled to resonant tunneling device 230 using any method suitable to form an effective connection, for example an air bridge 241 or any suitable metal interconnector. Although resonant tunneling device 230 is shown to be vertically integrated with resonant tunneling device 240, it should be understood that these elements may be coupled in any manner suitable to form an effective connection, such as an air bridge or any metal interconnector.

Optical receiver 210 may be constructed on a semi-insulating substrate 216. Substrate layer 216 is similar in structure and function to substrate 16 of optical receiver 10. Low-temperature grown photoconductor 220 includes an n+doped contact layer 222 which is disposed on substrate 212. Contact layer 222 is similar in structure and function to contact layer 18 of optical receiver 10. Photoconductor 220 further includes a low-temperature grown layer 224 disposed between contact layer 222 and an n+doped photoconductor contact layer 226. Layers 224 and 226 are similar in structure and function to layers 26 and 28, respectively, of optical receiver 10.

Resonant tunneling device 230 may be disposed on substrate 216. Resonant tunneling device 230 includes an n+doped contact layer 232 disposed on substrate 216. Contact layer 232 is similar in structure and function to contact layer 22 of optical receiver 10. Resonant tunneling device 230 further includes a double barrier structure 234 disposed between contact layer 232 and an n+doped contact layer 236. Double barrier structure 234 and contact layer 236 are similar in structure and function to double barrier structure 20 and contact layer 24, respectively, of optical receiver 10.

Resonant tunneling device 240 includes double barrier structure 242 which is disposed between contact layer 236 and an n+doped contact layer 244. Double barrier structure 242 and contact layer 244 are similar in structure and function to double barrier structure 20 and contact layer 24, respectively, of optical receiver 10. Resonant tunneling devices 230 and 240 share contact layer 236. Ohmic contacts 250, 252, 254 and 256 are formed on contact layers 222, 226, 236 and 244, respectively.

Figure 8:
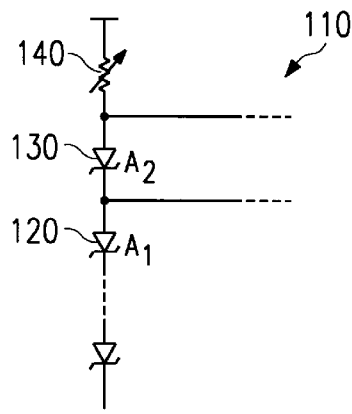
FIG. 8 is a simplified schematic diagram of an exemplary optical receiver circuit utilizing a plurality of resonant tunneling devices according to the teachings of the present invention.

FIG. 8 is an exemplary circuit representation of optical receivers 110 and 210. FIG. 8 shows a low-temperature grown photoconductor 140 coupled in series with a plurality of resonant tunneling devices 120 and 130 between bias voltage, $V_{cc}$, and ground. In operation, optical receivers 110 and 210 function similarly to optical receiver 10. Referring to optical receiver 110, photoconductor 140 receives an incident optical signal, causing a decrease in the voltage drop across the photoconductor. This decrease in voltage drop across photoconductor 140 causes a corresponding increase in voltage drop across resonant tunneling devices 120 and 130. Whether resonant tunneling devices 120 and 130 experience a switching event depends on the intensity of the optical signal, the effective areas $A_1$, and $A_2$ of resonant tunneling devices 120 and 130, respectively. By carefully choosing the thresholds of resonant tunneling devices 120 and 130, the bandwidth of optical receiver 110 may be increased. Implementing additional resonant tunneling devices will further increase the bandwidth of optical receiver 110. Optical receiver 210 functions in a similar manner.

Figure 9:
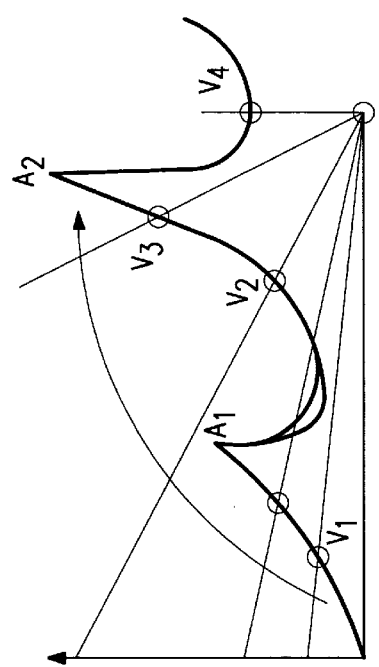
FIG. 9 is an exemplary current-voltage diagram of an optical receiver utilizing a plurality of resonant tunneling devices according to the teachings of the present invention.

FIG. 9 shows the current-voltage characteristic curves of optical receiver 110. The spiked responses represent the current-voltage characteristic of resonant tunneling devices 120 and 130. The size of the spikes in the current-voltage curve corresponds to the effective area, and thus resistance of the respective resonant tunneling device. The series of straight lines represent load lines of photoconductor 140 under various illumination conditions. Points $V_1$, $V_2$, $V_3$ and $V_4$ represent voltages at which switching events occur for each resonant tunneling device.

Figure 10:
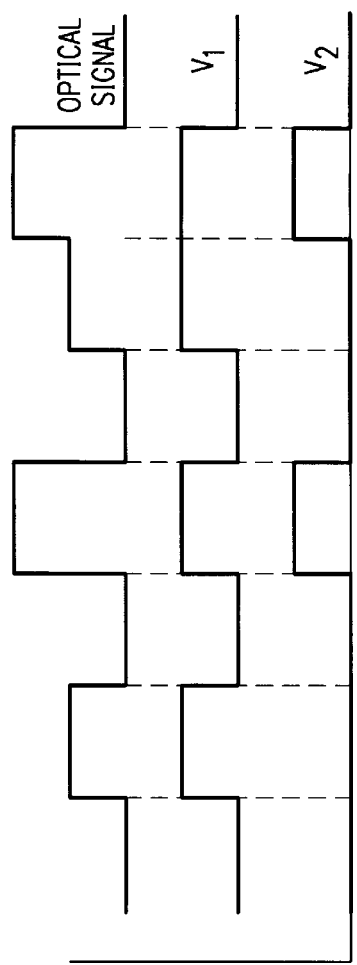
FIG. 10 is an exemplary timing diagram showing the response of an exemplary optical receiver utilizing a plurality of resonant tunneling devices to an incident optical signal according to the teachings of the present invention.

FIG. 10 is a timing diagram which illustrates the voltage drop, $V_1$ and $V_2$, across resonant tunneling devices 120 and 130 in response to an incident optical signal.

Although the present invention and its advantages have been described in detail, it should be understood that various changes, substitutions and alterations can be made therein without departing from the spirit and scope of the invention as defined by the appended claims.

What is claimed is:

1. An optical receiver, comprising:

a low-temperature grown photoconductor; and at least one resonant tunneling device coupled to the low-temperature grown photoconductor, the at least one resonant tunneling device including a double barrier structure being disposed on a first contact layer, and a second contact layer being disposed on the double barrier structure;

the low-temperature grown photoconductor including a low-temperature grown layer being disposed on the second contact layer of the at least one resonant tunneling device, and a photoconductor contact layer being disposed on the low-temperature grown layer.

2. The optical receiver, as set forth in claim 1, wherein the low-temperature grown photoconductor includes the material gallium arsenide.

3. The optical receiver, as set forth in claim 1, wherein the low-temperature grown photoconductor includes the material indium phosphide.

4. The optical receiver, as set forth in claim 1, wherein the low-temperature grown photoconductor includes the material indium gallium arsenide.

5. The optical receiver, as set forth in claim 1, further comprising at least one additional resonant tunneling device which is vertically integrated with the at least one resonant tunneling device.

6. The optical receiver, as set forth in claim 1, further comprising at least one additional resonant tunneling device which is coupled to the at least one resonant tunneling device.

7. A communications system including an optical receiver, comprising:

a low-temperature grown photoconductor; and at least one resonant tunneling device vertically integrated with the low-temperature grown photoconductor, the at least one resonant tunneling device including a double barrier structure being disposed on a first contact layer, and a second contact layer being disposed on the double barrier structure, the low-temperature grown photoconductor including a low-temperature grown layer being disposed on the second contact layer of the at least one resonant tunneling device, and a photoconductor contact layer being disposed on the low-temperature grown layer.

8. The communications system, as set forth in claim 7, further comprising at least one additional resonant tunneling device which is vertically integrated to the at least one resonant tunneling device.

9. The communications system, as set forth in claim 7, further comprising at least one additional resonant tunneling device which is coupled to the at least one resonant tunneling device.

10. An optical receiver, comprising:

a low-temperature grown photoconductor; and at least one resonant tunneling device coupled to the low-temperature grown photoconductor, the at least one resonant tunneling device including a double barrier structure being disposed on a first contact layer, and a second contact layer being disposed on the double barrier structure;

the low-temperature grown photoconductor including a low-temperature grown layer being disposed on a first photoconductor contact layer which is coupled to the at least one resonant tunneling device, and a second photoconductor contact layer being disposed on the low-temperature grown layer.

11. The optical receiver, as set forth in claim 10, wherein the low-temperature grown photoconductor includes the material gallium arsenide.

12. The optical receiver, as set forth in claim 10, wherein the low-temperature grown photoconductor includes the material indium phosphide.

13. The optical receiver, as set forth in claim 10, wherein the low-temperature grown photoconductor includes the material indium gallium arsenide.

14. The optical receiver, as set forth in claim 10, further comprising at least one additional resonant tunneling device which is vertically integrated with the at least one resonant tunneling device.

15. The optical receiver, as set forth in claim 10, further comprising at least one additional resonant tunneling device which is coupled to the at least one resonant tunneling device.

* * * * *